(12) United States Patent
Tsao (10) Patent No.: US 8,074,000 B2
(45) Date of Patent: Dec. 6, 2011

(54) HOTKEY PROCESSING METHOD AND COMPUTER SYSTEM

(75) Inventor: Wen Chun Tsao, Taipei Hsien (TW)

(73) Assignee: Wistron Corp., New Taipei (TW)

( * ) Notice: Subject to any disclaimer, the term of this patent is extended or adjusted under 35 U.S.C. 154(b) by 319 days.

(21) Appl. No.: 12/352,563

(22) Filed: Jan. 12, 2009

(65) Prior Publication Data

US 2010/0049882 A1    Feb. 25, 2010

(30) Foreign Application Priority Data

Aug. 19, 2008    (TW) ................ 97131547 A (51) Int. Cl.
*G06F 13/12* (2006.01)
*G06F 13/38* (2006.01)

(52) U.S. Cl. ........................................ 710/67

(58) Field of Classification Search ............ None
See application file for complete search history.

(56) References Cited

U.S. PATENT DOCUMENTS

| | | | | |
|---|---|---|---|---|
| 5,241,646 A | * | 8/1993 | Arai ................ | 710/67 |
| 5,875,348 A | * | 2/1999 | Matsushima et al. ...... | 710/4 |
| 5,881,318 A | * | 3/1999 | Liebenow ............. | 710/67 |
| 7,170,498 B2 | * | 1/2007 | Huang ................ | 710/67 |
| 2006/0038787 A1 | * | 2/2006 | Kuo .................. | 345/168 |

OTHER PUBLICATIONS

A. Kayode Adesemowo and William D. Tucker. 2005. Instant messaging on handhelds: an affective gesture approach. South African Institute for Computer Scientists and Information Technologists, , Republic of South Africa, 244-251.*

Manu Kumar, Andreas Paepcke, and Terry Winograd. 2007. EyePoint: practical pointing and selection using gaze and keyboard. ACM, New York, NY, USA, 421-430. DOI=10.1145/1240624.1240692 http://doi.acm.org/10.1145/1240624.1240692.*

* cited by examiner

*Primary Examiner* — Tariq Hafiz
*Assistant Examiner* — Dayton Lewis-Taylor (57) ABSTRACT

A key processing method for use in a computer system having at least one BIOS (basic input output system) and one controller is disclosed. The method comprises the following steps. After a predetermined time period, it is first determined whether a specific hotkey has been pressed. If so, the BIOS acquires identification data of the specific hotkey from the controller and performs a corresponding service.

20 Claims, 6 Drawing Sheets

HOTKEY PROCESSING METHOD AND COMPUTER SYSTEM

CROSS REFERENCE TO RELATED APPLICATIONS

This Application claims priority of Taiwan Patent Application No. 97131547, filed on Aug. 19, 2008, the entirety of which is incorporated by reference herein.

BACKGROUND OF THE INVENTION

1. Field of the Invention

The invention relates to key processing methods and related computer systems, and more particularly, to key processing methods and related computer systems for hotkeys.

2. Description of the Related Art

To provide simple and convenient functions for users, hotkeys, such as function keys F1 to F12 or various combinations of keys are typically provided by a conventional computer system. A user may request to perform a specific function by using the predefined or user-defined hotkeys.

Generally, one trigger event, such as an interrupt, may be generated when one hotkey is pressed. Should such an event occur, a conventional operating system would conduct an interrupt procedure, wherein programs that are operating would be halted and the hotkey service routine would be activated and conducted until completion or disablement. Therefore, interruption of operations or programs (e.g. computer operations or game programs) which are running due to hotkeys, may be inconvenient for users.

BRIEF SUMMARY OF THE INVENTION

Simple hotkey processing methods and computer systems are provided to improve convenience for users without using interrupt signals.

An embodiment of a key processing method for use in a computer system having at least one BIOS (basic input output system) and one controller is provided. The method comprises the following steps. After a predetermined time period, it is first determined whether a specific hotkey has been pressed. If so, the BIOS acquires identification data of the specific hotkey from the controller and performs a corresponding service.

An embodiment of a computer system is also provided. The computer system comprises a controller and a BIOS. The controller receives a key input. The BIOS is coupled to the controller and after a predetermined time period, determines whether the received key input is a specific hotkey input. If so, the BIOS acquires identification data of the specific hotkey from the controller and performs a service corresponding to the identification data of the specific hotkey.

Another embodiment of a key processing method for use in a computer system having at least one BIOS and one controller is further provided. The method comprises the following steps. A key input is first received and a service corresponding to identification data of the key input is performed by the BIOS or the controller based on the identification data, wherein the identification data represents whether the key input is a specific hotkey input. When the key input is not the specific hotkey input, the service is directly performed by the controller. When the key input is the specific hotkey input, a flag is configured and the identification data is recorded by the controller such that the BIOS, after a predetermined time period, acquires the identification data from the controller and performs the service corresponding to the identification data according to the configuration of the flag.

BRIEF DESCRIPTION OF THE DRAWINGS

The invention can be more fully understood by reading the subsequent detailed description and examples with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
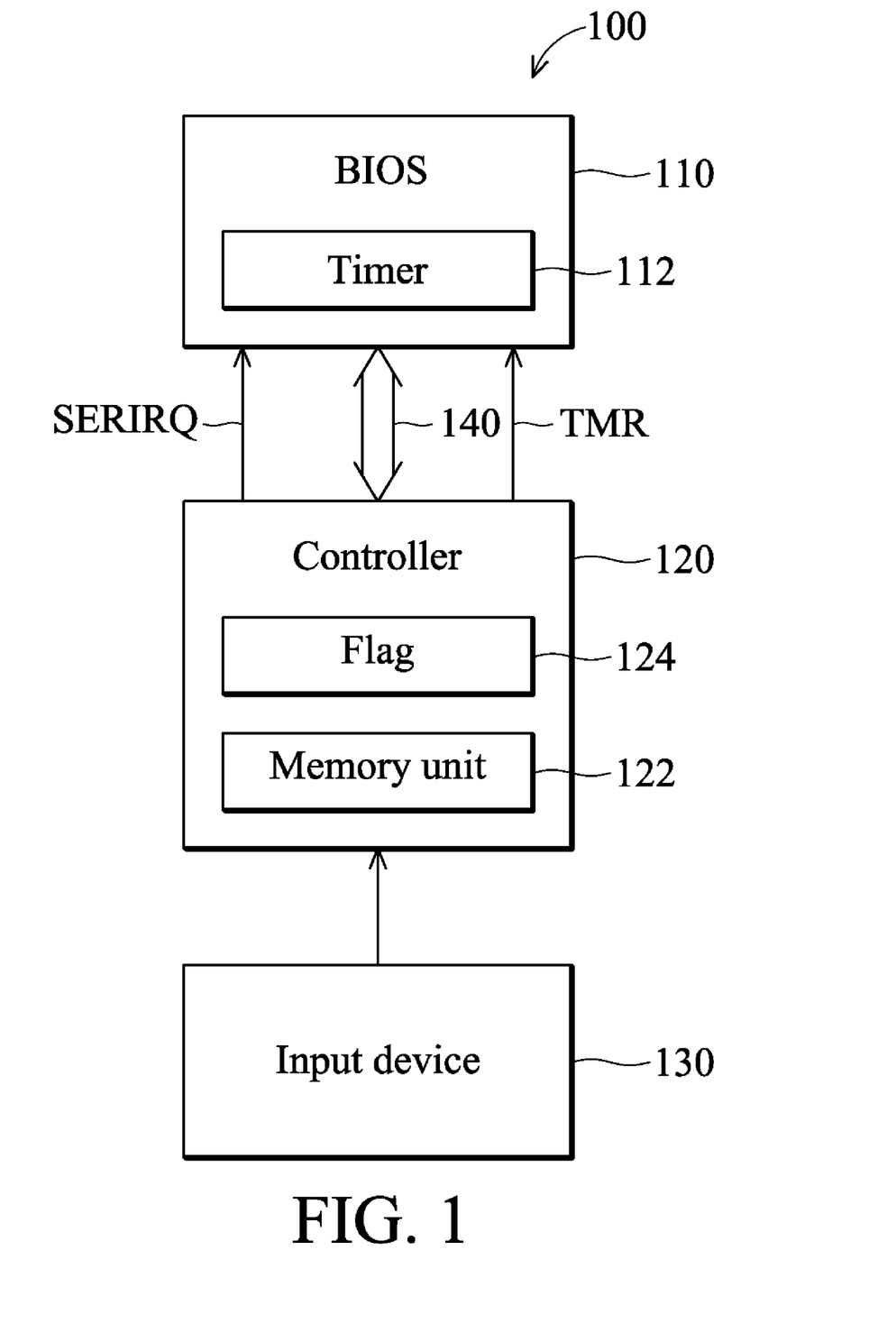
FIG. 1 shows a block diagram of an embodiment of a computer system according to the invention.

FIG. 1 shows a block diagram of an embodiment of a computer system 100 according to the invention. The computer system 100 at least comprises a basic input output system 110 (hereinafter referred to as BIOS), a controller 120 (e.g. a microprocessor) and an input device 130 (e.g. a button, a keyboard or a switch). The BIOS may comprise service routines or related software/firmware of a number of specific hotkeys for performing services corresponding to the specific hotkeys, wherein the specific hotkeys are a number of predefined keys, combination of keys which is a combination of more than one key, buttons or the like for providing specific functions. The controller 120 may comprise a memory unit 122 (e.g. a random access memory (RAM)) and a flag 124 in which the flag 124 may be implemented by selecting at least one bit of an input output (IO) pin as the flag for representing whether any specific hotkeys have been pressed. For example, the selected bit will be set to "1" (i.e. the flag 124 is set to be "1") when one specific hotkey has been pressed and the selected bit will be reset/clear to "0" (i.e. the flag 124 is set to be "0") after identification data (e.g. a key value) of the pressed specific hotkey has been read. The BIOS and the controller 120 may transmit data to each other through a bus 140 (e.g. a low pin count (LPC) bus) or other interfaces connected therebetween. The BIOS may send a BIOS command to the controller 120 through the bus 140 and the controller 120 may transmit data to the BIOS through the bus 140. The memory unit 122 is used to store identification data of a specific hotkey. Note that, in computer system, a normal key, a specific key, a hotkey, a button or a combination of keys, each have a specific (usually unique) identification data (i.e. a unique key value) for identifying which key has been pressed.

Therefore, the key or combination of keys that has been pressed may be determined by the identification data.

The input device 130 may be used for inputting data. When a user inputs data through the input device 130 (such as a keyboard) such that a key or a combination of keys have been pressed, a key interrupt will be generated accordingly to inform the controller 120 that a key or a combination of keys have been pressed. When detecting the key interrupt, the controller 120 may read out the identification data of the pressed key and perform a service corresponding thereto.

The controller 120 may have an interrupt signal line SERIRQ, and, when the inputted key is identified as an normal key (such as keys A-Z) and not a hotkey, the controller 120 may output the identification data of the detected key and set the interrupt signal line SERIRQ for further processing. The controller 120 may further generate a counting period (or a counting cycle) for the BIOS via a clock signal line TMR. The clock signal line TMR may utilize the system clock signal of the controller 120 to generate a clock signal with a predetermined time period. The BIOS may further comprise a timer 112, wherein the timer 112 is used for periodical counting according to the clock signal generated by the clock signal line TMR and activates an inspection procedure to inspect whether any specific hotkey has been pressed after each predetermined time period.

Figure 2:
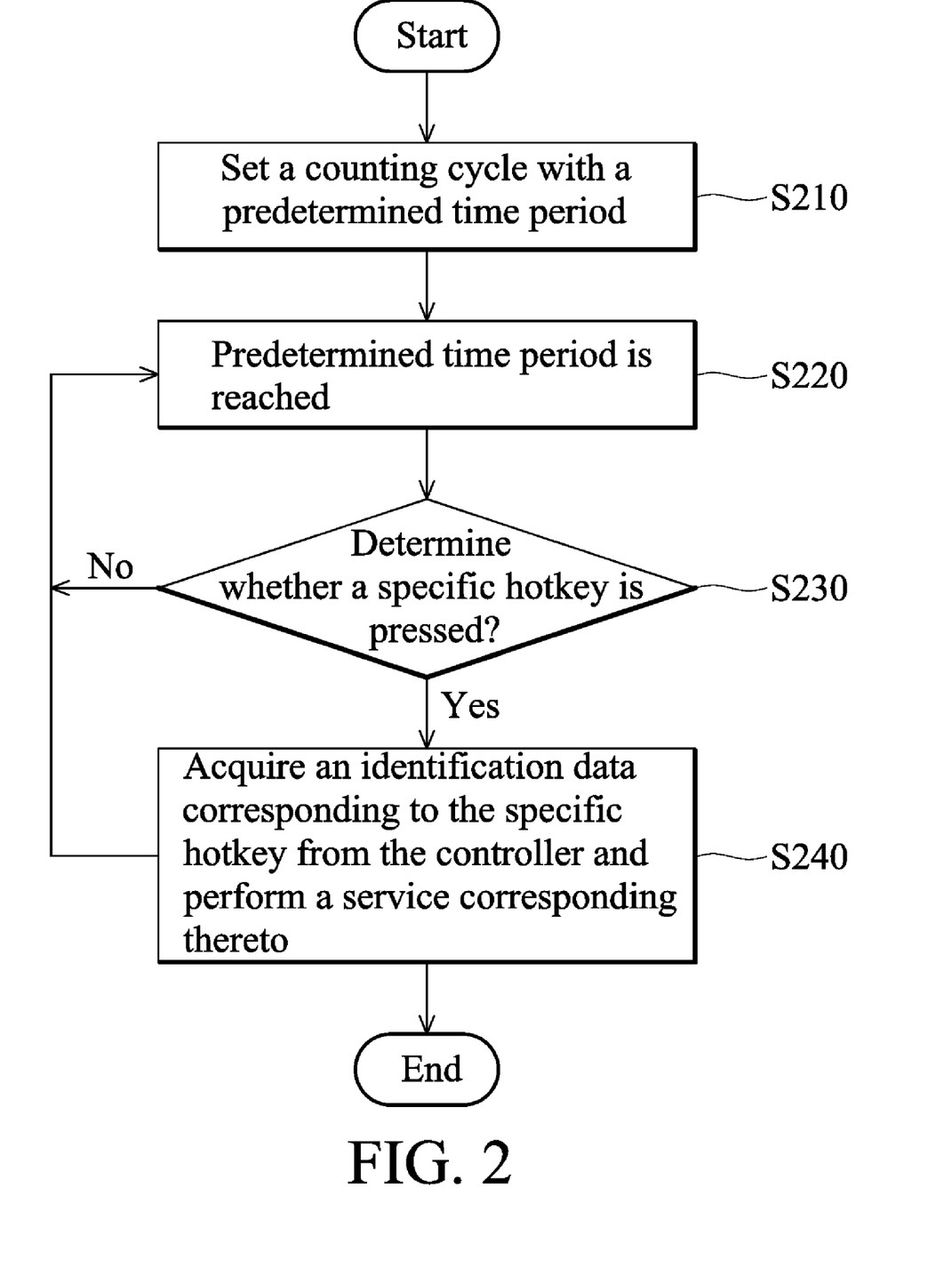
FIG. 2 is a flowchart illustrating an embodiment of a key processing method according to the invention.

FIG. 2 is a flowchart illustrating an embodiment of a key processing method according to the invention for use in the computer system 100. In step S210, a counting cycle is first set for the BIOS, wherein the counting cycle repeats once every predetermined time period (e.g. 1 second). Thereafter, in step S220, the BIOS determines whether a specific hotkey has been pressed after every predetermined time period (step S230). If it is determined that no specific hotkey has been pressed (No in step S230), which means that no service is needed to be performed by the BIOS, no operation will be performed and the steps returns to step S220 to wait for the next predetermined time period. Contrarily, if it is determined that a specific hotkey has been pressed (Yes in step S230), in step S240, the BIOS acquires identification data corresponding to the pressed specific hotkey from the controller 120 and then performs a corresponding service which corresponds to the acquired identification data of the pressed specific hotkey. The BIOS may, for example, send predetermined BIOS commands to request the identification data of the specific hotkeys stored in the memory unit 122 of the controller 120. For example, if the specific hotkey is defined to be the combination of keys "Fn" plus "F5", the BIOS may perform a service corresponding to the hotkey ("Fn" plus "F5"), such as toggling the display screen of the display.

Figure 3:
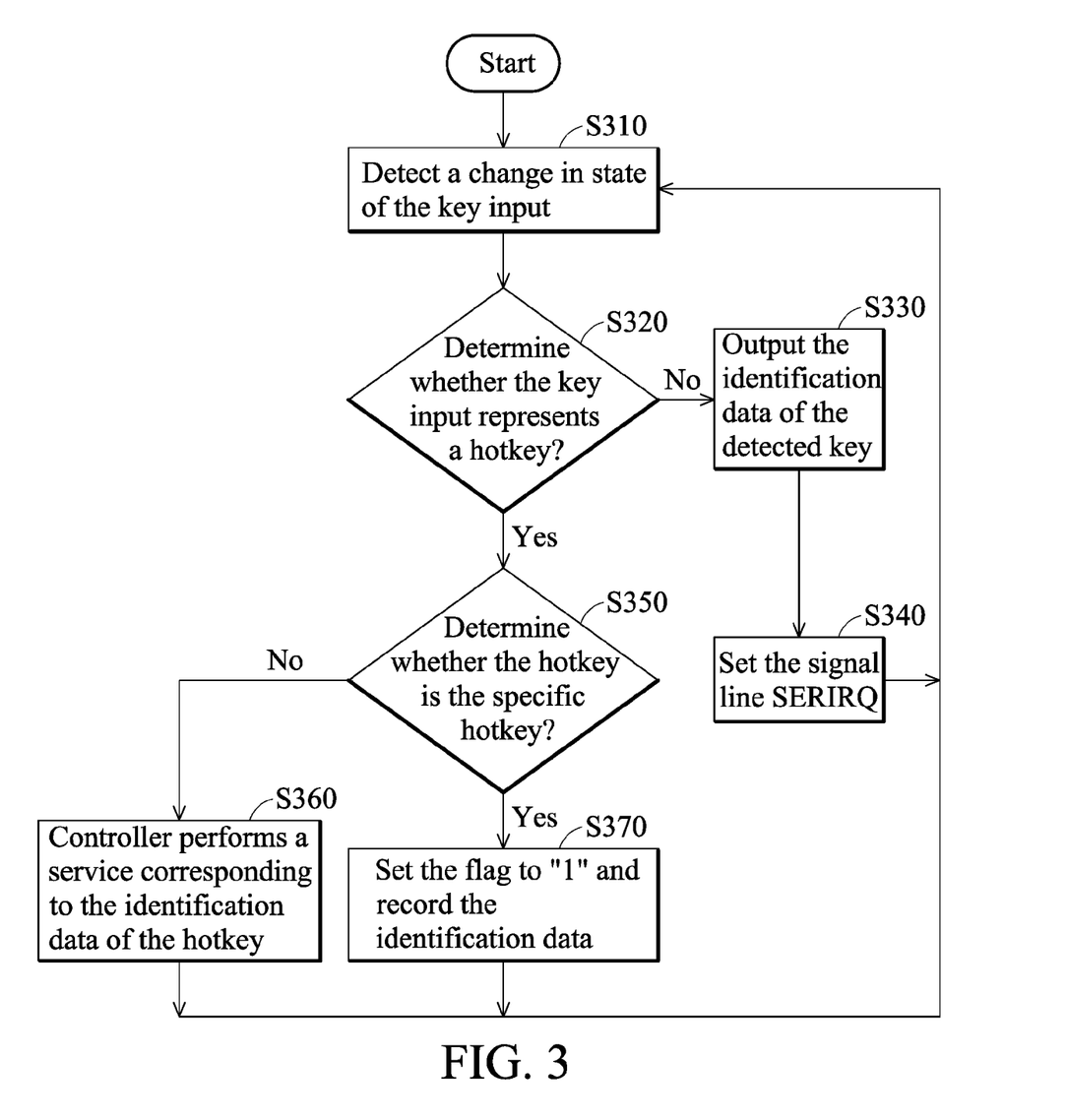
FIG. 3 is a flowchart illustrating another embodiment of a key processing method according to the invention for illustrating a process for the controller when receiving a key input.

FIG. 3 is a flowchart illustrating another embodiment of a key processing method according to the invention for illustrating a process for the controller 120 when receiving a key input. In this embodiment, it is assumed that one bit serves as the flag and its initial value is 0. When any key of the keyboard, button or switch has been pressed, the controller 120 detects that the state of the key input has changed (step S310). Accordingly, it is determined whether the key input represents a hotkey (step S320). In this step, which key has be pressed may be determined by identifying the identification data of the pressed key. If the pressed key is not a hotkey (No in step S320), that is, a normal key (e.g. keys [A]-[Z] has been pressed, the identification data of the detected key will be outputted (step S330) and the signal SERIRQ will be set (step S340).

On the other hand, if the pressed key is a hotkey (Yes in step S320), since the service routine related to the hotkey may be stored in either the controller 120 or the BIOS, it is further determined whether the pressed hotkey is the specific hotkey (step S350), i.e. determined whether the service routine of the pressed hotkey belongs to a BIOS service routine. If so, which means that the specific hotkey has already been pressed, the bit is set to 1 and the identification thereof (i.e. the key value of the specific hotkey) is stored in the memory unit 122 (step S370). If the pressed hotkey does not belong to the specific hotkey, which means that another hotkey may have been pressed, the controller 120 directly activates the service routine corresponding to the pressed key so as to perform a corresponding service (step S360). For example, if the keys "[Fn] plus [F12]" represents a request to turn off the display screen of the display and the service routine corresponding thereto has been stored in the controller 120, the controller 120 will, in response to the detected key(s), perform the service routine to turn off the display screen of the display.

Figure 4:
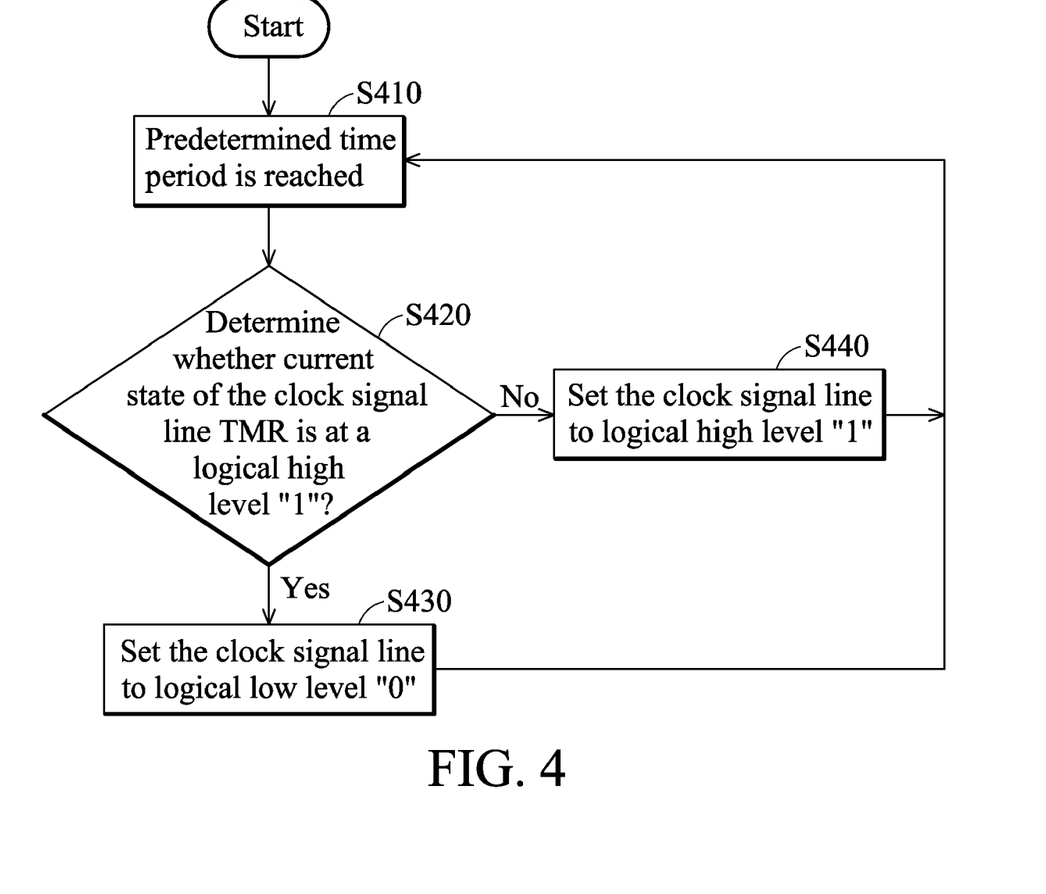
FIG. 4 is a flowchart illustrating another embodiment of a key processing method according to the invention for generating a counting clock for the BIOS.

FIG. 4 is a flowchart illustrating another embodiment of a key processing method according to the invention for generating a counting clock for the timer 112 of the BIOS. It is assumed that, in this embodiment, the counting clock for the timer 112 of the BIOS is configured as one second per times and the clock signal line TMR is initially set to a logical low level "0" so that the controller 120 sends out a clock signal every one-half second (i.e. a half of the counting cycle of the clock signal line TMR) via the clock signal line TMR. When the predetermined time period is completed (i.e. one-half second) or is reached (step S410), it is determined whether the current state of the clock signal line TMR is at a logical high level "1" (step S420). If the current state of the clock signal line TMR is at a logical high level "1" (Yes in step S420), the clock signal line TMR is set to logical low level "0" (step S430). If the current state of the clock signal line TMR is not in at a logical high level "1" (No in step S420), i.e. the state of the clock signal line TMR is at a logical low level "0", the clock signal line TMR is set to a logical high level "1" (step S440). Thus, the counting clock (i.e. one second) which is needed for the timer 112 of the BIOS can be generated by the toggling state of the clock signal line TMR every one-half second. In addition to generating the clock via the clock signal line TMR, a timer within a South-Bridge (not shown) may also be utilized and then the BIOS may further configure a corresponding register to configure a desired counting cycle.

Figure 5:
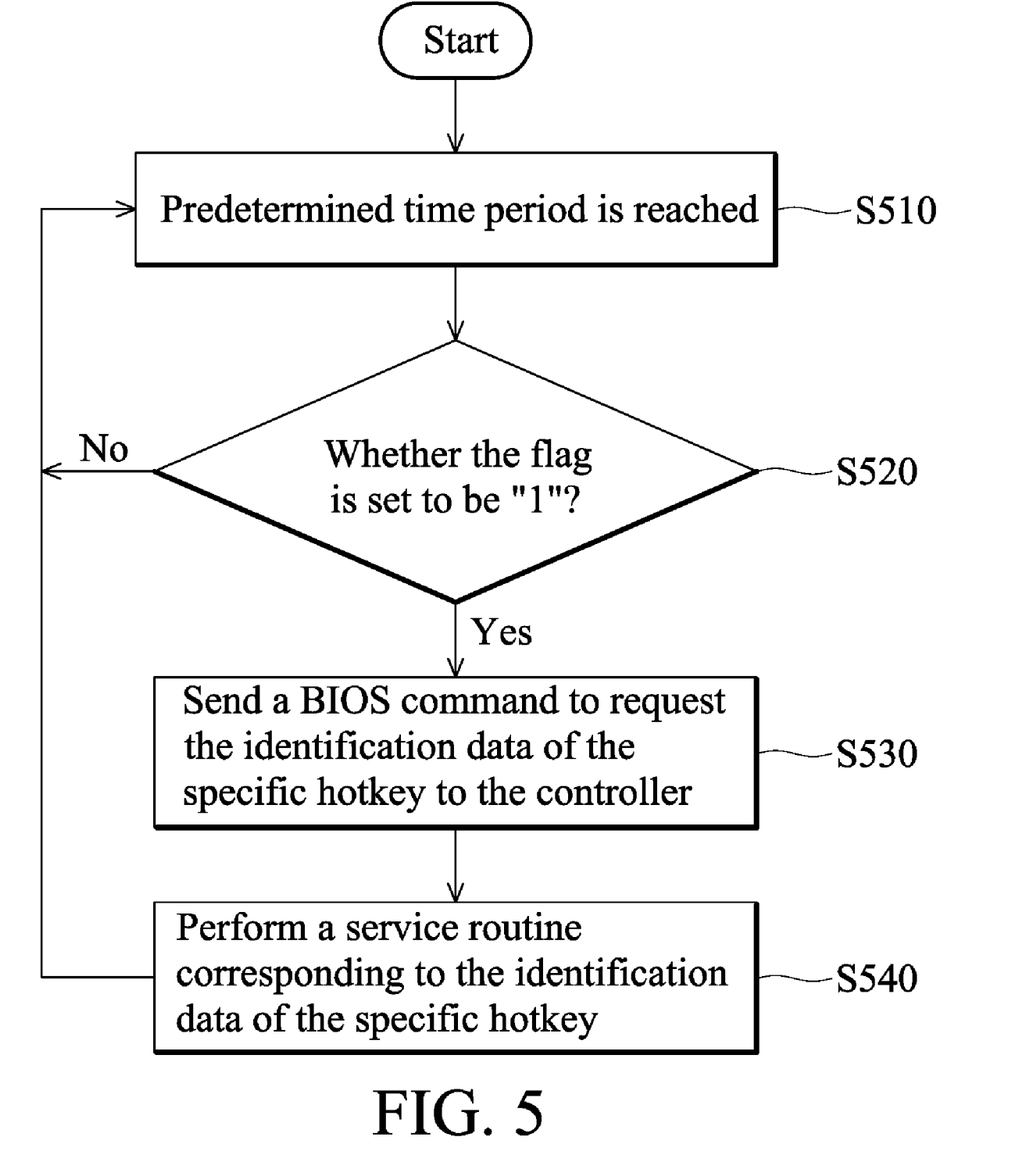
FIG. 5 is a flowchart illustrating another embodiment of a key processing method according to the invention for use in the BIOS.

FIG. 5 is a flowchart illustrating another embodiment of a key processing method according to the invention for use in the BIOS. The steps shown in FIG. 5 will be performed every predetermined time period by the BIOS. As shown in FIG. 5, after a predetermined time period (step S510), it is determined whether the flag in the controller 120 is set to be 1, i.e. whether the flag has been configured (step S520). If so (Yes in step S520), which means that a specific hotkey has been pressed, the BIOS sends a request, via a BIOS command, to the controller 120 to acquire the identification data of the specific hotkey (step S530). After the identification data of the specific hotkey has been acquired, the BIOS performs a service routine corresponding to the identification data of the specific hotkey to provide a required service (step S540). After the execution of the service routine is completed, the steps return back to step S510 to wait for a next predetermined time period. If the flag is set to be 0 (No is step S520), which means that no specific hotkey has been pressed, the steps directly return to step S510 to wait for a next predetermined time period.

Figure 7:
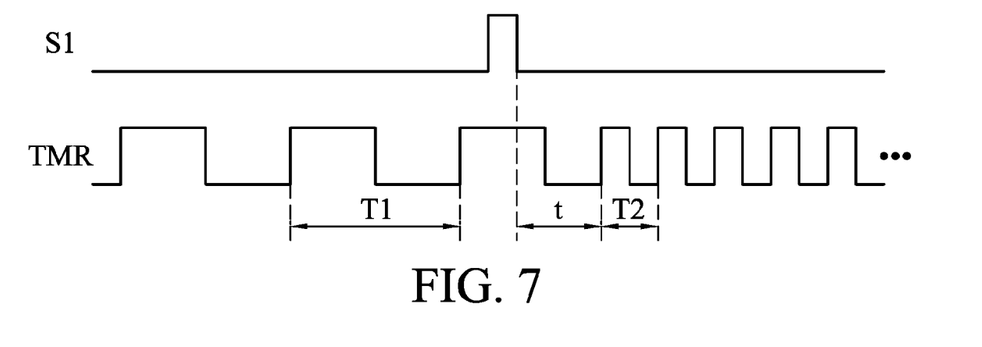
FIG. 7 is a timing diagram illustrating a clock signal provided by the controller for the BIOS according to the invention.

In one embodiment, when the flag in the controller 120 has been set to 1, the BIOS may request to shorten the length of time of the predetermined time period, such as shorten the length of time from 1 second per times to 0.1 second per times in order to precisely determine what key has been pressed. FIG. 7 is a timing diagram illustrating a clock signal provided by the controller 120 for the BIOS according to the invention, wherein the signal line S1 is used for representing whether the specific hotkey has been pressed or not. When any specific hotkey has been pressed, a pulse will be accordingly generated in the signal line S1. As shown in FIG. 7, when a specific hotkey has been pressed, after a predefined time period t, the clock signal of the clock signal line TMR is shortened from the original time period T1 (e.g. 1 second per times) to another shorter time period T2 (e.g. 0.1 second per times). Note that such acceleration mechanism may be triggered by the BIOS. The predetermined time period of the clock signal line TMR, for example, may be immediately shortened when it is determined that the specific hotkey has been pressed or during the next counting cycle. For such a case, the shortened time period for the clock signal line TMR will be kept for a predetermined time period and will be adjusted to the original time length as required.

Figure 6:
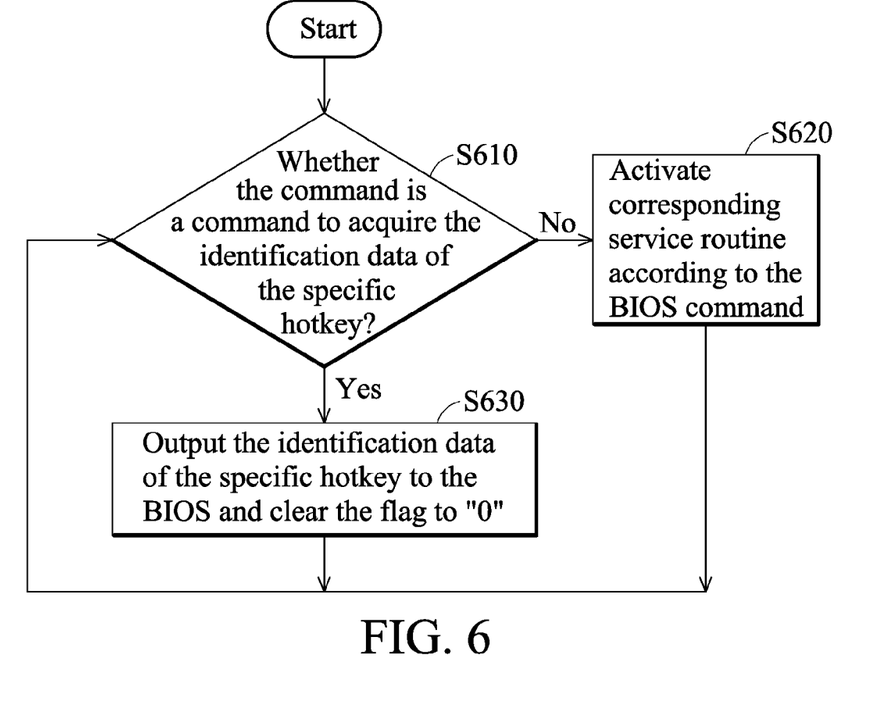
FIG. 6 is a flowchart illustrating another embodiment of a key processing method according to the invention for processing a BIOS command by the controller.

FIG. 6 is a flowchart illustrating another embodiment of a key processing method according to the invention for processing a BIOS command by the controller 120. When receiving a BIOS command sent by the BIOS, the controller 120 first determines whether the received BIOS command is a command to acquire the identification data of the specific hotkey (step S610). If the received BIOS command is not a command to acquire the identification data of the specific hotkey, a corresponding service routine will be activated according to the BIOS command (step S620). If the received BIOS command is a command to acquire the identification data of the specific hotkey (Yes in step S610), the controller 120 will output the identification data of the specific hotkey stored in the memory unit 122 to the BIOS via the bus and then perform a flag clearing operation to clear the flag to "0" (step S630).

In one embodiment, if the computer system is compatible with the ACPI standard, the aforementioned method may be implemented by using the Levent event mode, that is, the operating system controls and determines data transmission performance. Therefore, data transmission can be performed only when the operation system is not busy, so that, not like conventional key processing methods and systems, wherein the operation of the operation system is immediately interrupted, the operation of the operation system using the key processing methods and systems of the invention can keep the operation system running.

For illustration, steps of the key processing method of the invention are detailed in the following embodiment.

In this embodiment, it is assumed that the counting cycle used by the timer 112 of the BIOS is set as 1 second per times, the flag is set to be the bit 5 of the input output (IO) pin 6Ch and the specific hotkey is set as the combination hotkey "[Fn] plus [F5]" which represents a request for an operation of toggling the display. It is also assumed that the specific hotkey "[Fn] plus [F5]" will be pressed after three seconds. For 3 seconds, the specific hotkey "[Fn] plus [F5]" has not been pressed and thus when the BIOS reads the bit 5 of the IO pin 6Ch representing the flag, the bit 5 of the IO pin 6Ch is always "0". Therefore, no operation is performed. When the specific hotkey "[Fn] plus [F5]" has been pressed, the controller 120 determines that the pressed hotkey is the specific hotkey input and thus sets the bit 5 of the IO pin 6Ch to be "1" and records the identification data X corresponding to the hotkey "[Fn] plus [F5]" in the memory unit 122. On the 4$^{th}$ second, the BIOS inspects that the bit 5 of the IO pin 6Ch is "1" and thus acquires the identification data X of the hotkey "[Fn] plus [F5]" from the memory unit 122. Accordingly, the BIOS performs a corresponding service routine to toggle the display according to the identification data X.

In summary, with the key processing method and system of the invention, when a specific event has been triggered or a specific hotkey has been pressed, the controller may first record the specific event, so that undergoing tasks by the user will not be immediately interrupted. Thus, operation programs which are being used by a user will not be interrupted, thereby improving user convenience.

While the invention has been described by way of example and in terms of preferred embodiment, it is to be understood that the invention is not limited thereto. To the contrary, it is intended to cover various modifications and similar arrangements (as would be apparent to the skilled in the art). Therefore, the scope of the appended claims should be accorded to the broadest interpretation so as to encompass all such modifications and similar arrangements.

What is claimed is:

1. A key processing method for use in a computer system having at least one BIOS (basic input output system) and one controller, comprising:

determining, by the BIOS, after a predetermined time period repeatedly, whether a specific hotkey has been pressed, wherein the predetermined time period is generated by a clock signal line of a South-Bridge chip or the controller; if it is determined that a specific hotkey has been pressed, the BIOS acquires an identification data of the specific hotkey from the controller and performs a service corresponding to the identification data of the specific hotkey; and shortening the length of the predetermined time period during a next counting cycle after determining that the hotkey is the specific hotkey in order to precisely determine what key has been pressed, wherein the shortened time period will be kept for a predetermined time period.

2. The key processing method of claim 1, wherein the step of determining whether the specific hotkey has been pressed is performed by determining whether a flag of the controller has been configured.

3. The key processing method of claim 2, wherein the step of acquiring the identification data of the specific hotkey from the controller is performed by sending a BIOS command to the controller to request the identification data of the specific hotkey.

4. The key processing method of claim 3, further comprising: outputting the identification data of the specific hotkey to the BIOS and clearing the flag.

5. The key processing method of claim 1, further comprising:
detecting a change in state of a key input;
determining whether the key input represents a hotkey; and
determining whether the hotkey is the specific hotkey.

6. The key processing method of claim 5, further comprising:
configuring a flag of the controller and recording identification data corresponding to the specific hotkey when the hotkey is the specific hotkey.

7. The key processing method of claim 5, further comprising:
performing a service, by the controller, corresponding to the identification data of the hotkey when the hotkey is not the specific hotkey.

8. The key processing method of claim 1, further comprising: configuring a counting cycle with the predetermined time period.

9. The key processing method of claim 1, wherein the flag is at least one bit of an input output port.

10. A computer system, comprising:
a controller for receiving a key input;
a BIOS (basic input output system) coupled to the controller, determining whether the received key input is a specific hotkey after a predetermined time period, and if so, acquiring identification data of the specific hotkey from the controller and performing a service corresponding to the identification data of the specific hotkey, wherein the predetermined time period is generated by a clock signal line of a South-Bridge chip or the controller; and
a timer for counting with the clock signal and determining whether the key input is the specific hotkey after the predetermined time period;
configured such that the length of the predetermined time period is shortened during a next counting cycle after determining that the hotkey is the specific hotkey, wherein the shortened time period will be kept for a predetermined time period.

11. The computer system of claim 10, further comprising an input device coupled to the controller, wherein the input device is a button, a keyboard or a switch for generating the key input.

12. The computer system of claim 10, wherein the controller further comprises the clock signal line for generating a clock signal with the predetermined time period.

13. The computer system of claim 10, wherein the controller further comprises:
a memory unit for storing the identification data of the specific hotkey; and
a flag for representing whether the received key input is the specific hotkey, wherein the flag represents that the specific hotkey has been pressed.

14. The computer system of claim 13, wherein the controller further determines, when receiving the key input, whether the received key input is the specific hotkey and if so, configures the flag and stores the identification data of the specific hotkey into the memory unit.

15. The computer system of claim 14, wherein the BIOS further determines whether the flag is configured to determine whether the received key input is the specific hotkey.

16. The computer system of claim 15, wherein the BIOS further sends a BIOS command to the controller to request the identification data of the specific hotkey and acquires the identification data of the specific hotkey from the memory unit when determining that the received key input is the specific hotkey.

17. The computer system of claim 16, wherein the controller further outputs the identification data of the specific hotkey to the BIOS and clears the flag after receiving the BIOS command.

18. The computer system of claim 17, further comprising a bus coupled between the controller and the BIOS for transmitting the BIOS command and the identification data of the specific hotkey therebetween.

19. A key processing method for use in a computer system having at least one BIOS (basic input output system) and one controller, comprising:
receiving a key input;
performing a service, by the BIOS or the controller, corresponding to identification data of the key input, based on the identification data, wherein the identification data represents whether the key input is a specific hotkey input;
when the key input is not the specific hotkey input, directly performing the service by the controller; and;
when the key input is the specific hotkey input, shortening the length of the predetermined time period during a next counting cycle in order to precisely determine what key has been pressed, confirming a flag and recording the identification data by the controller such that the BIOS, after a predetermined time period, acquires the identification data from the controller and performs the service corresponding to the identification data according to the configuration of the flag, wherein the predetermined time period is generated by a clock signal line of a South-Bridge chip or the controller, and wherein the shortened time period will be kept for a predetermined time period.

20. The key processing method of claim 19, further comprising:
sending a BIOS command, by the BIOS, to the controller to request the identification data of the specific hotkey; and
outputting the identification data of the specific hotkey, by the controller, to the BIOS and clearing the flag, by the controller, when receiving the BIOS command.

* * * * *